United States Patent
Walter et al.

(10) Patent No.: US 6,717,276 B2
(45) Date of Patent: Apr. 6, 2004

(54) TWO-METAL LAYER BALL GRID ARRAY AND CHIP SCALE PACKAGE HAVING LOCAL INTERCONNECTS USED IN WIRE-BONDED AND FLIP-CHIP SEMICONDUCTOR ASSEMBLY

(75) Inventors: David N. Walter, Dallas, TX (US); Masood Murtuza, Sugarland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/241,399

(22) Filed: Sep. 10, 2002

(65) Prior Publication Data
US 2004/0046265 A1 Mar. 11, 2004

(51) Int. Cl.$^7$ .......................... H01L 23/48; H01L 23/52; H01I 29/40
(52) U.S. Cl. ........................................ 257/779; 257/678
(58) Field of Search ................................ 257/737, 738, 257/777, 779, 787, 780, 781, 782, 783, 778, 792, 707, 678

(56) References Cited
U.S. PATENT DOCUMENTS 5,866,942 A * 2/1999 Suzuki et al. ............... 257/698
6,350,668 B1 * 2/2002 Chakravorty ............... 438/612
6,477,046 B1 * 11/2002 Stearns et al. .............. 361/704
6,486,549 B1 * 11/2002 Chiang ...................... 257/723

* cited by examiner

Primary Examiner—David Nhu
(74) Attorney, Agent, or Firm—Yingsheng Tung; Wade James Brady, III; Frederick J. Telecky, Jr.

(57) ABSTRACT

The present invention comprises a low cost device (10, 20) and a method (30) of forming an electrical interconnect between two metal substrate layers configured in a flip-chip format or a wire bonded format. The invention includes a first metal substrate layer (12), a second metal substrate layer (14), and an organic tape layer (16) attached therebetween as a dielectric. The organic tape layer (16) includes a series of spaced apart vias (15) adapted to receive solder paste (13). The second metal layer (14) includes a plurality of openings (40,42,44) spaced along the surface thereof and coaxially aligned with the spaced vias (15). Further, the invention includes a plurality of solder balls (17, 18, 19) placed across the respective openings (40,42,44) of the second metal layer (14) such that each solder ball (17–19) attaches to the solder paste (13) forming an electrical interconnect running substantially in parallel between the metal layers (12, 14). The solder balls are adapted to communicate I/O signals or power to/from an IC supported on the first layer.

20 Claims, 1 Drawing Sheet

TWO-METAL LAYER BALL GRID ARRAY AND CHIP SCALE PACKAGE HAVING LOCAL INTERCONNECTS USED IN WIRE-BONDED AND FLIP-CHIP SEMICONDUCTOR ASSEMBLY

FIELD OF THE INVENTION

The present invention is generally related to the field of semiconductor assembly and packaging, and more particularly, to the field of packaged semiconductor devices in a flip chip format or wire-bonded format.

BACKGROUND OF THE INVENTION

Many semiconductor devices are typically packaged on a single layer substrate of medium or low electrical performance characteristics. Generally, the costs of packaging a semiconductor chip on a multi-layer, high performance substrate can be high depending on the design format of the device as well as on the number of devices that are produced. Semiconductor manufacturers have attempted to lower the cost of multi-layer substrate packaged devices by standardizing design rules and manufacturing techniques, but have not yet achieved customer cost expectations. One of the primary reasons for the increased cost of the multilayer substrate design is the processing required to electrically connect the various metal layers in the substrate. Presently this is done by the substrate suppliers themselves and then provided to the assembly operations. The conventional methods of providing electrical interconnections between the different associated layers of the multi-layer substrate are electrolessly deposited and/or sputtered metals providing the interconnect between the multiple layers. These two process techniques are generally expensive and time-consuming.

Thus, there is desired a technique in semiconductor chip assembly and packaging of cost-effectively providing a local electrical interconnect between two or more metal substrate layers without having to use the conventional methods. Such a technique would greatly improve the performance of a semiconductor chip packaged in either a flip-chip or a wire-bonded format while not reducing electrical performance. Moreover, such a technique would greatly shorten the time in which a semiconductor chip is packaged and, in turn, will lower its production costs.

SUMMARY OF THE INVENTION

The present invention achieves technical advantages as a low cost apparatus and method of providing a layer-to-layer electrical interconnect between two metal layers used in the assembly of flip-chip and wire-bonded packages. Advantageously, the present invention provides for an electrical connection between the two metal layers to he made without using conventional methods of forming the interconnect, such as, by electrolessly depositing the interconnect, for example. The invention also advantageously allows for a layer-to-layer connection to be achieved between the two metal layers without using a sputtered interconnect.

In one embodiment, the present invention is a two metal layered ball grid array having generally planar first and second metal layers. The second metal layer includes a plurality of openings at spaced intervals across the surface thereof. The invention also includes an organic tape layer coupled between the first and second metal layers. In a selected embodiment, the organic tape layer is preferably comprised of a dielectric material, such as a copper-coated polyimide tape. The organic tape layer also has a plurality of vias at spaced intervals and which are aligned with the openings of the second metal layer. Preferably, these vias function as receiving channels for receiving a conductive material, such as solder paste, for example. Further, the invention includes a plurality of solder balls aligned with the openings of the second metal layer such that the solder balls are adapted to attach to the solder paste to form a series of electrical interconnects. The solder balls run substantially in parallel between the first and second metal layers.

In another embodiment, a method of forming one or more interconnects between the first and second metal layers is presented. The method includes forming a plurality of vias spaced apart along an organic tape layer such that the vias provide an interconnect between the two metal layers. The method of the present invention also includes the step of forming a plurality of corresponding openings across the surface of one of the metal layers and generally near the vias of the organic tape layer. Solder paste is deposited in the respective vias and a plurality of solder balls are attached across the respective openings of the second metal layer such that the solder balls are heat wetted to the solder paste to form a plurality of substantially parallel electrical interconnects between the first and second metal layers.

BRIEF DESCRIPTION OF THE DRAWINGS

Advantages of the invention and the specific embodiments will be understood by those of ordinary skill in the art by reference to the following detailed description of preferred embodiments taken in conjunction with the drawings, in which.

DETAILED DESCRIPTION OF THE PREFERRED EMBODIMENT

The numerous innovative teachings of the present invention will be described with particular reference to the presently preferred exemplary embodiments. However, it should be understood that this class of embodiments provides only a few examples of the many advantageous uses and innovative teachings herein. In general, statements made in the specification of the present application do not necessarily delimit any of the various claimed inventions. Moreover, some statements may apply to some inventive features, but not to others.

Figure 1:
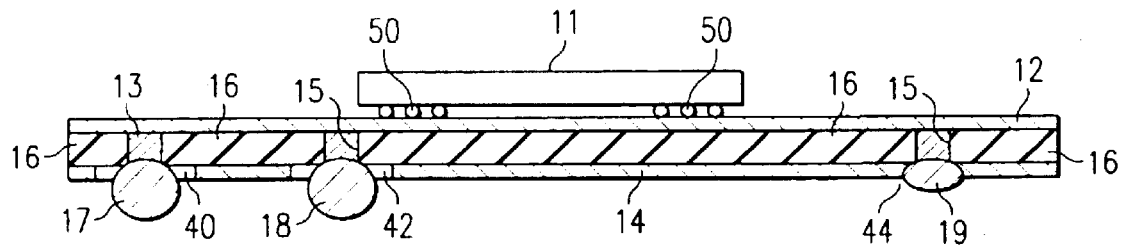
FIG. 1 shows two metal substrates having a flip-chip semiconductor chip coupled to the top surface thereof in accordance with an exemplary embodiment of the present invention.

Referring now to FIG. 1, there is generally shown at 10 a two metal layer ball grid array (BGA) configured in a flip-chip format. The present invention includes a first metal substrate layer 12, a second metal substrate layer 14, and an organic tape layer 16 coupled therebetween. In a preferred embodiment, the organic tape layer 16 is comprised of an adhesive material, preferably, a laminated dielectric material, such as copper-coated polyimide material on both sides thereof The organic tape layer 16 also includes a plurality of vias 15 at spaced apart intervals which are proximate a plurality of openings 40, 42, and 44 defined through and spaced along the surface of the second metal layer substrate 14. These vias 15 terminate at selected portions of the first metal layer 12 and are aligned substantially in parallel to each other and function as receiving channels for receiving an electrically conductive material, such as, solder paste 13, for example.

Preferably, solder balls 17, 18, and 19 are disposed over and within the respective openings 40, 42, and 44 of the second metal layer 14 and aligned with the vias 15. Advantageously, each respective solder ball 17, 18, and 19 attaches to the solder paste 13 to form the series of fixed electrical interconnects through the organic tape layer 16 to the selected portions first metal layer 12. In a selected embodiment, these newly formed interconnects may be adapted to provide basic information signals to the semiconductor chip 11 via electrical traces defined on the first metal substrate layer 12 and solder bumps 50, such as, input/output (I/O) signals via balls 17 and 18 being electrically isolated from the second metal substrate layer 14. Further, these interconnects may be adapted to provide power and ground functionality to the semiconductor chip 11, whereby solder ball 19 is coupled to the second metal substrate layer 14 and a surface of the first metal layer 12 by the respective paste filled via 15.

Hence, the present invention advantageously provides a series of parallel electrical interconnects between the two metal substrate layers of the package supporting the semiconductor chip 11 formed as a BGA without having to form the interconnects therebetween using a traditional sputtering technique or without having to form the interconnect electrolessly.

Figure 2:
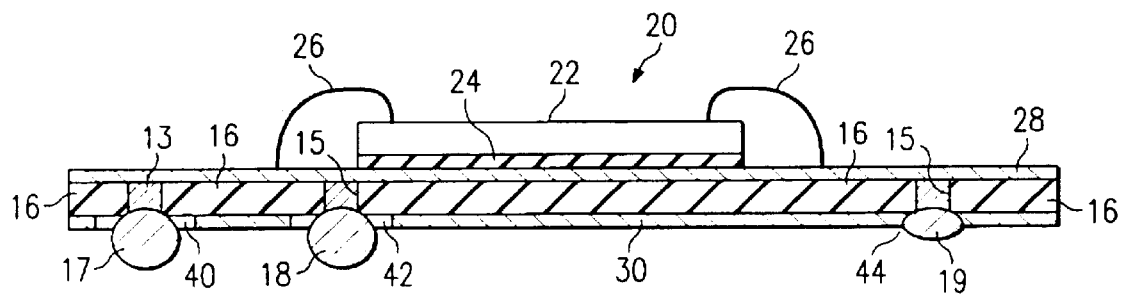
FIG. 2 shows two metal substrates having a wire-bonded semiconductor chip coupled thereto in accordance with the present invention.

Referring now to FIG. 2, there is shown at 20 a two metal substrate layer configuration of the present invention having a semiconductor chip 22 attached thereto in a wire-bonded format. Unlike FIG. 1, the semiconductor chip 22 is supported upon a dielectric material 24 and interconnected to an upper surface of a first metal layer 28 via connecting wires 26. Here, the local interconnects are similarly formed between first metal substrate layer 28 and a second metal substrate layer 30 when the solder paste 13 deposited within the respective vias 15 of the organic tape layer 16 attaches to each solder ball 17, 18, and 19.

Figure 3:
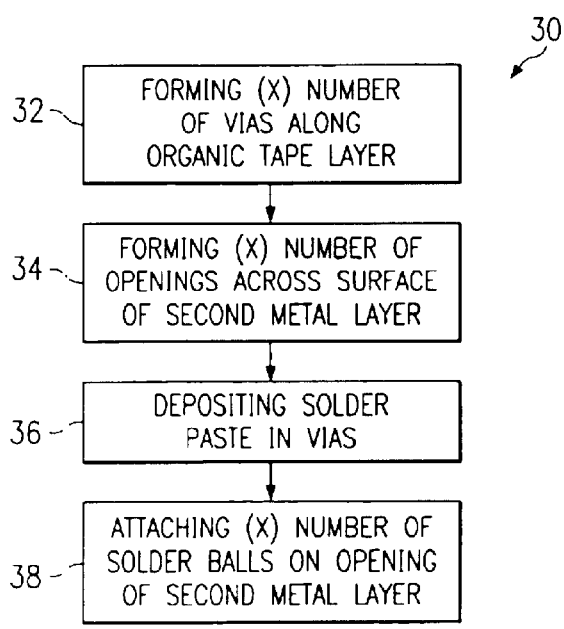
FIG. 3 shows a flow diagram of the method of the present invention.

Turning now to FIG. 3, there is shown at 30 a methodology of the present invention wherein a plurality of side-to-side electrical interconnects are formed along a dielectric organic tape substrate 16 which is coupled between metal substrate layers 12 and 14.

At step 32, the plurality of vias 15 are formed within and across the organic tape layer substrate 16 at spaced apart intervals. These vias 15 are arranged to run substantially in parallel with each other between metal layers 12 and 14.

At step 34, respective openings 40, 42, and 44 are formed along a surface of the second metal substrate layer 14 which are proximate the vias 15.

At step 36, solder paste is then deposited into each respective via 15. Thereafter, an array of solder balls 17, 18, and 19 are aligned across respective openings 40, 42, and 44 of the second metal layer.

Next, an attaching step 38 follows whereby the respective solder balls 17, 18, and 19 attach to the solder paste 13 deposited within the vias 15 to form a series of electrical interconnects running substantially in parallel between metal layers 12 and 14.

The present invention advantageously allows for an electrical interconnect to be formed between the two metal substrate layers without using either the conventional electroless method or the sputtered method of forming the interconnect the two metal layers. Advantageously, the present invention also provides for an improved performance, low-cost semiconductor chip package configured as a BGA or a wire-bonded assembly.

Though the invention has been described with respect to specific preferred embodiments, many variations and modifications will become apparent to those skilled in the art upon reading the present application. It is therefore the intention that the appended claims be interpreted as broadly as possible in view of the prior art to include all such variations and modifications.

What is claimed is:

1. A semiconductor device, comprising:
   a first metal substrate layer;
   a second metal layer having a plurality of openings at spaced apart intervals;
   a dielectric material coupled between said first and second metal layers and having a plurality of vias at spaced apart intervals such that said openings of said second metal layer are generally aligned with said vias;
   a plurality of solder balls, said solder balls being aligned with said openings of said second metal layer; and
   solder paste disposed within said vias, wherein said solder paste holds said solder balls such that they are aligned proximate said opening of said second metal layer, forming a fixed electrical interconnect between said first metal layer and said solder balls.

2. The device as specified in claim 1 further comprising an integrated circuit coupled to said first metal substrate layer in a flip-chip format.

3. The device as specified in claim 2 wherein one of said electrical interconnect balls are adapted to provide an input/output (I/O) signal function to said integrated circuit.

4. The device as specified in claim 2 wherein one of said electrical interconnect solder balls is adapted to provide a power function to said integrated circuit.

5. The device as specified in claim 2 wherein one of said electrical interconnect balls are adapted to provide a signal ground function to said integrated circuit.

6. The device as specified in claim 1 further comprising an integrated circuit wire bonded to said first metal layer.

7. The device as specified in claim 1 wherein said dielectric material comprises an organic tape.

8. The device as specified in claim 7 wherein said organic tape comprises a polyimide tape, said polyimide tape having copper applied to both sides thereof.

9. The device as specified in claim 2 wherein said first metal substrate layer is adapted to rate signals from said vias to said integrated circuit.

10. The device as specified in claim 1 wherein said solder balls and said solder paste are heat wetted to form an electrical interconnect substantially in parallel between said first and second metal layers.

11. A semiconductor device, comprising:
    a first metal substrate layer;
    a second metal layer having a plurality of openings at spaced apart intervals;
    a dielectric material coupled between said first and second metal layers and having a plurality of vias at spaced apart intervals such that said openings of said second metal layer are generally aligned with said vias;
    conductive material disposed within said vias;
    solder balls aligned with said openings of said second metal layer and in contact with said conductive material disposed within said vias.

12. The semiconductor device of claim 11, wherein said conductive material is solder paste.

13. The device as specified in claim 11 further comprising an integrated circuit coupled to said first metal substrate layer in a flip-chip format.

14. The device as specified in claim 13 wherein one of said electrical interconnect balls are adapted to provide an input/output (I/O) signal function to said integrated circuit.

15. The device as specified in claim 13 wherein one of said electrical interconnect solder balls is adapted to provide a power function to said integrated circuit.

16. The device as specified in claim 13 wherein one of said electrical interconnect balls are adapted to provide a signal ground function to said integrated circuit.

17. The device as specified in claim 11 further comprising an integrated circuit wire bonded to said first metal layer.

18. The device as specified in claim 11 wherein said dielectric material comprises an organic tape.

19. The device as specified in claim 18 wherein said organic tape comprises a polyimide tape, said polyimide tape having copper applied to both sides thereof.

20. The device as specified in claim 11 wherein said solder balls are heat wetted and electrical interconnect substantially in parallel between said layers.

* * * * *